(12) United States Patent
Lee et al.

(10) Patent No.: US 11,521,911 B2
(45) Date of Patent: Dec. 6, 2022

(54) CONFORMABLE HEAT SINK PEDESTAL FOR MULTI-CHIP PACKAGES

(71) Applicant: Intel Corporation, Santa Clara, CA (US)

(72) Inventors: Eng Kwong Lee, Pinang (MY); Tung Lun Loo, Kedah (MY)

(73) Assignee: INTEL CORPORATION, Santa Clara, CA (US)

( * ) Notice: Subject to any disclaimer, the term of this patent is extended or adjusted under 35 U.S.C. 154(b) by 207 days.

(21) Appl. No.: 17/092,364

(22) Filed: Nov. 9, 2020

(65) Prior Publication Data
US 2022/0068755 A1    Mar. 3, 2022

(30) Foreign Application Priority Data

Aug. 28, 2020   (MY) .............................. PI2020004457

(51) Int. Cl.
*H01L 23/373*  (2006.01)
*H01L 23/367*  (2006.01)

(52) U.S. Cl.
CPC ........ *H01L 23/3735* (2013.01); *H01L 23/367* (2013.01)

(58) Field of Classification Search
CPC ..... H01L 21/50; H01L 23/367; H01L 23/373; H01L 23/3731; H01L 23/3733; H01L 23/3735; H01L 23/3736; H01L 23/3737
See application file for complete search history.

(56) References Cited

U.S. PATENT DOCUMENTS

| 2008/0150127 A1* | 6/2008 | Raravikar | ............. | H01L 23/373 |
| | | | | 257/E23.101 |
| 2016/0247744 A1* | 8/2016 | Uehling | ................ | H01L 23/373 |

OTHER PUBLICATIONS

AAEON an ASUS assoc. co., "BOXER-6638U" https://www.aaeon.com/en/p/fanless-embedded-box-pc-boxer-6638u; printed on Aug. 25, 2020.
iBASE, "Embedded Computing ASB200-909" https://www.ibase.com.tw/english/ProductDetail/EmbeddedComputing/ASB200-909; printed on Aug. 25, 2020.

\* cited by examiner

*Primary Examiner* — Allan R Wilson
(74) *Attorney, Agent, or Firm* — Viering, Jentschura & Partner mbB

(57) ABSTRACT

The present disclosure relates to a heat sink pedestal including a composite material. The composite material may include at least one layer of a thermally conductive primary material and at least one layer of a thermally conductive secondary material. The composite material may include a conductivity ratio of lateral thermal conductivity (Kz) to planar thermal conductivity (Kx, Ky) of the composite material of at least 0. The heat sink pedestal may be conformable to a shape of a semiconductor chip.

20 Claims, 6 Drawing Sheets

CONFORMABLE HEAT SINK PEDESTAL FOR MULTI-CHIP PACKAGES

CROSS-REFERENCE TO RELATED APPLICATIONS

This application claims priority to Malaysian Application No. PI2020004457, filed on Aug. 28, 2020, which is incorporated herein in its entirety.

BACKGROUND

Embedded computing products are mainly personal computer (PC) systems used as edge devices for internet-of-things (IOT) applications. These edge devices are generally fanless systems, whereby a top surface of the edge device may be made of a heat sink (e.g., aluminum) for cooling purposes. The heat sink draws heat away from a heat source or a heat-generating component.

In general, a base of the heat sink has a metal pedestal that makes contact with a processor die (i.e., a heat source) for a direct heat transfer. The metal pedestal is required for clearing any interference between components (such as resistors, capacitors, and dual in-line memory modules) around the processor die. A gap filler, also known as a thermal interface material, is further disposed between the processor die and the metal pedestal to fill up any microscopic unevenness on the surface of the process die to avoid any air gap that hinders heat dissipation. Arranged in this manner, the heat generated by the processor die is transferred to the heat sink via the thermal interface material and the metal pedestal.

However, whenever the location and/or height of the process die changes due to an improved or new design of the edge devices, a relocation and/or resizing of the metal pedestal may be required. Furthermore, the modifications to the metal pedestal may be more complicated and time consuming if the processor die is a multi-chip package.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
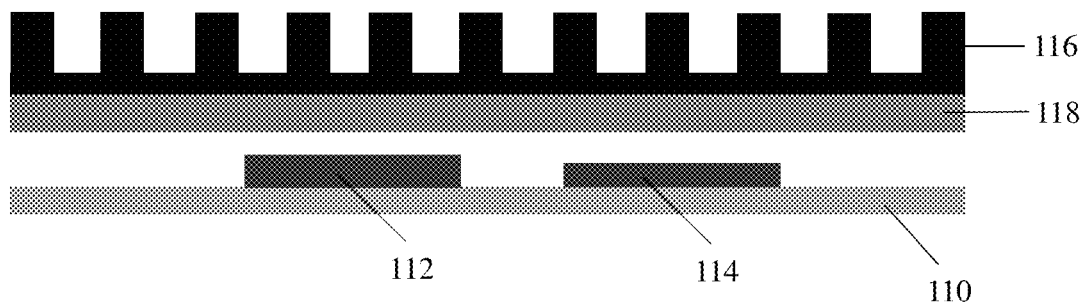
FIG. 1A shows an illustration of a heat sink including a conformable heat sink pedestal, before assembly, according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The advantages of the present disclosure may include substantial savings in the mechanical design effort and resources when the processor die needs to be relocated. In an aspect of the present disclosure, the heat sink may not include a metal pedestal, thereby eliminating the need for a realignment of the heat sink pedestal to the multi-chip package location on a motherboard. This may minimize the effort to make mechanical changes on the heat sink for every generation of a product, thereby shortening the time to market the final IOT edges devices. The same heat sink may be reused for future generations of processors, as long as the power envelop is within the heat sink cooling capability.

Another advantage of the present disclosure may include a use of a conformable heat sink pedestal, which self-conforms to a shape of the processor die, regardless of the number of chips on the multi-chip package.

The present disclosure generally relates to a heat sink pedestal including a composite material. The composite material may include at least one layer of a thermally conductive primary material and at least one layer of a thermally conductive secondary material. The composite material may include a conductivity ratio of lateral thermal conductivity (Kz) to planar thermal conductivity (Kx, Ky) of at least 0.1, and the heat sink pedestal may be conformable to a shape of a semiconductor chip.

In various aspects of the present disclosure, the lateral thermal conductivity (Kz) of the composite material may be given by Eq. 1, $$Kz = T/\Sigma(t_i/k_i) \quad \text{(Eq. 1)}$$

wherein:

T represents the total thickness of the composite material;

i is an integer and represents the $i^{th}$ layer in the composite material;

t represents the thickness of a layer in the composite material;

k represents the bulk thermal conductivity of a layer in the composite material.

In various aspects of the present disclosure, the planar thermal conductivity (Kx, Ky) of the composite material may be given by Eq. 2, $$Kx \text{ or } Ky = \Sigma(t_i \cdot k_i)/T \quad \text{(Eq. 2)}$$

wherein:

T represents the total thickness of the composite material;

i is an integer and represents the $i^{th}$ layer in the composite material;

t represents the thickness of a layer in the composite material;

k represents the bulk thermal conductivity of a layer in the composite material.

The present disclosure also generally relates to a device that may include a heat sink, at least one semiconductor chip, and a heat sink pedestal arranged between the heat sink and the semiconductor chip for heat transfer. The heat sink pedestal may include a composite material. The composite material may include at least one layer of a thermally conductive primary material and at least one layer of a thermally conductive secondary material. The composite material may include a conductivity ratio of lateral thermal conductivity (Kz) to planar thermal conductivity (Kx, Ky) of at least 0.1, and the heat sink pedestal may conform to a shape of the at least one semiconductor chip.

The present disclosure further generally relates to a method that may include providing a heat sink and a semiconductor chip. The method may further include arranging a heat sink pedestal between the heat sink and the semiconductor chip, pressing the heat sink pedestal into the semiconductor chip to deformably shape the heat sink pedestal to fit over the semiconductor chip. The heat sink pedestal may include a composite material. The composite material may include at least one layer of a thermally conductive primary material and at least one layer of a thermally conductive secondary material. The composite material may include a conductivity ratio of lateral thermal conductivity (Kz) to planar thermal conductivity (Kx, Ky) of at least 0.1.

To more readily understand and put into practical effect the present disclosure, particular aspects will now be described by way of examples and not limitations, and with reference to the drawings. For the sake of brevity, duplicate descriptions of features and properties may be omitted.

FIG. 1A shows an illustration of a heat sink including a conformable heat sink pedestal, before assembly, according to an aspect of the present disclosure.

In the aspect shown in FIG. 1A, a package substrate 110 may be provided. A first chip 112 and a second chip 114 may be arranged on the package substrate 110. There can be more than 2 chips arranged on the package substrate 110. Alternatively, there can be only one chip arranged on the package substrate 110. The first chip 112 may include a height that may be the same or different from a height of the second chip 114.

Further, there may be one or more additional components (not shown) arranged around the first chip 112 and/or second chip 114 on the package substrate 110. The additional components may include, but not limited to, resistors, capacitors, and dual in-line memory modules.

A heat sink 116 may be provided. In the aspect shown in FIG. 1A, the heat sink 116 may include a fin arrangement at a top section of the heat sink 116 to increase the surface area of the heat sink 116 for better heat transfer. The heat sink 116 may be made of aluminum alloys, for example.

A heat sink pedestal or material 118 may be provided. In the aspect shown in FIG. 1A, the heat sink pedestal 118 may be applied or attached to a base of the heat sink 116. The heat sink pedestal 118 may cover partially or fully the base of the heat sink 116.

Figure 1B:
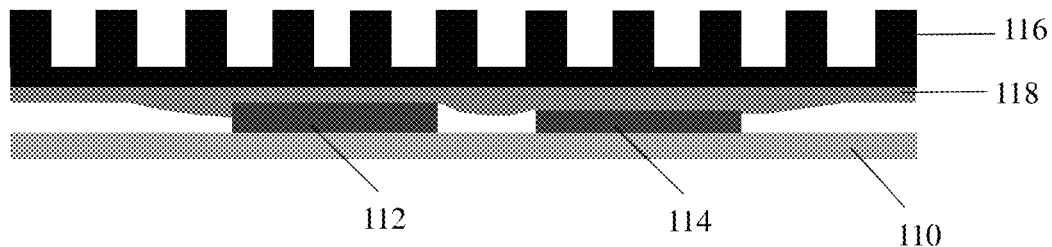
FIG. 1B shows an illustration of a heat sink including a conformable heat sink pedestal, after assembly, according to an aspect of the present disclosure shown in FIG. 1A.

FIG. 1B shows an illustration of a heat sink including a conformable heat sink pedestal, after assembly, according to an aspect of the present disclosure shown in FIG. 1A.

During assembly, a pressure may be applied to bring the heat sink pedestal 118 into contact with the first chip 112 and the second chip 114. In the aspect shown in FIG. 1B, when the pressure is applied to press the heat sink pedestal 118 against the first chip 112 and the second chip 114, the heat sink pedestal 118 may be compressed and deformed to adapt to the shape or contour of the first chip 112 and the second chip 114. In other words, the heat sink pedestal 118 may conform to the shape of the first chip 112 and the second chip 114.

The heat sink pedestal 118 may completely cover a top surface of the first chip 112. The heat sink pedestal 118 may also completely cover a top surface of the second chip 114. The heat sink pedestal 118 may further cover partially at least one side of the first chip 112. The heat sink pedestal 118 may also further cover partially at least one side of the second chip 114. The heat sink pedestal 118 may also fill up any microscopic unevenness on a surface of the first chip 112 and the second chip 114 to avoid any air gap that may hinder heat dissipation.

In an aspect of the present disclosure, the heat sink 116 may not include a metal pedestal attached to the base. The top surface of the first chip 112 and the second chip 114 may not include a conventional thermal interface material for contact with a metal pedestal of a heat sink.

Therefore, an advantage of the present disclosure may be the heat sink pedestal 118 may replace the use of a metal pedestal and a conventional thermal interface material for heat transfer from the first chip 112 and the second chip 114 to the heat sink 116.

In an aspect of the present disclosure, the heat sink pedestal 118 may include a composite material. The composite material may include a plurality of alternating layers including a primary material and a secondary material. In other words, the composite material may be formed of a first layer of the primary material having a first primary material thickness and a first layer of the secondary material having a first secondary material thickness. In one aspect, the primary material may be too hard or rigid, and therefore may not be sufficiently compressible. Accordingly, a secondary material may be included in the composite material to improve the compressibility of the composite material.

There may be additional layers of the primary material and/or secondary material in the composite material. Each primary material thickness may be the same or different. Each secondary material thickness may be the same or different.

In various aspects, a layer including the primary material of the composite material may make contact with the first chip 112 and the second chip 114. In other aspects, a layer including the secondary material of the composite material may make contact with the first chip 112 and the second chip 114.

In various aspects, a layer including the primary material of the composite material may make contact with the heat sink 118. In other aspects, a layer including the secondary material of the composite material may make contact with the heat sink 118.

The primary material may include a bulk thermal conductivity (k). In various aspects of the present disclosure, the primary material may include graphite, graphene, or a combination of other highly conductive elements such as silver, copper, or aluminum. A list of materials including their thermal conductivity may be found at https://en.wikipedia.org/wiki/List_of_thermal_conductivities, for example.

The secondary material may include a bulk thermal conductivity (k). In various aspects of the present disclosure, the secondary material may include a silica composite, alumina foam, alumina-silica fiber, manganese, nickel, copper, silver, silver-copper, tin, carbon fiber, aluminum, alumina, boron nitride, or aluminum nitride particles.

In various aspects of the present disclosure, the thermally conductive primary material may have a higher thermal conductivity than the thermally conductive secondary material. In further aspects, the layer of the thermally conductive primary material may be thicker than the layer of the thermally conductive secondary material.

The composite material may include a planar thermal conductivity (Kx, Ky). The composite material may further include a lateral thermal conductivity (Kz). The lateral thermal conductivity (Kz) of the composite material may be less than its planar thermal conductivity (Kx, Ky).

In all aspects of the present disclosure, the lateral thermal conductivity (Kz) of the composite material may be at least one-tenth of its planar thermal conductivity (Kx, Ky). If the lateral thermal conductivity (Kz) of the composite material is less than one-tenth of its planar thermal conductivity (Kx, Ky), then the composite material may not be able to conduct heat transfer as efficiently as a conventional heat sink including a metal pedestal and a thermal interface material. In other words, the heat sink pedestal may include a conductivity ratio of lateral thermal conductivity (Kz) to planar thermal conductivity (Kx, Ky) of at least 0.1. Generally, the higher the conductivity ratio, the more preferred the composite material may be.

Figure 2B:
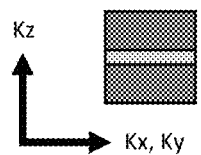
FIG. 2B shows a side view of a conformable heat sink pedestal according to an aspect of the present disclosure shown in FIG. 2A.
Figure 2A:
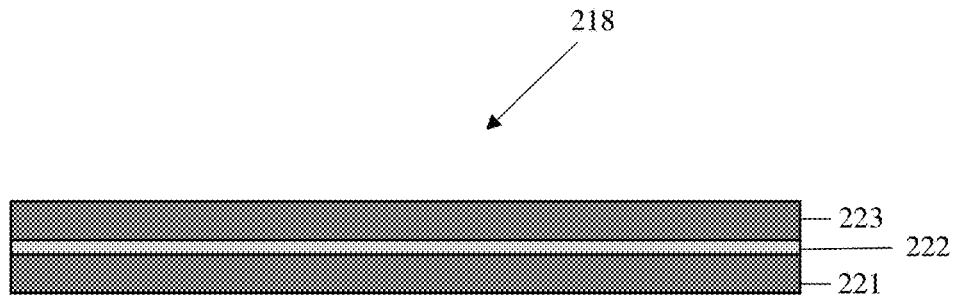
FIG. 2A shows a cross-section view of a conformable heat sink pedestal according to an aspect of the present disclosure.

FIG. 2A shows a cross-section view of a conformable heat sink pedestal 218 according to an aspect of the present disclosure.

In one aspect, the composite material of the heat sink pedestal 218 may include a total of three distinct layers. A first layer 221 may include a first primary material of the composite material. A second layer 222 may include a secondary material of the composite material. A third layer 223 may include a second primary material of the composite material. The second layer 222 may be arranged between the first and third layers (221, 223) of the composite material. The second primary material may be the same or different from the first primary material of the composite material. Each of the three layers (221, 222, 223) may include a same or different thickness from one another.

FIG. 2B shows a side view of a conformable heat sink pedestal 218 according to an aspect of the present disclosure shown in FIG. 2A.

The composite material may include a planar thermal conductivity (Kx, Ky) in an x-y axis. The composite material may include a lateral thermal conductivity (Kz) in the z-axis.

Figure 2C:
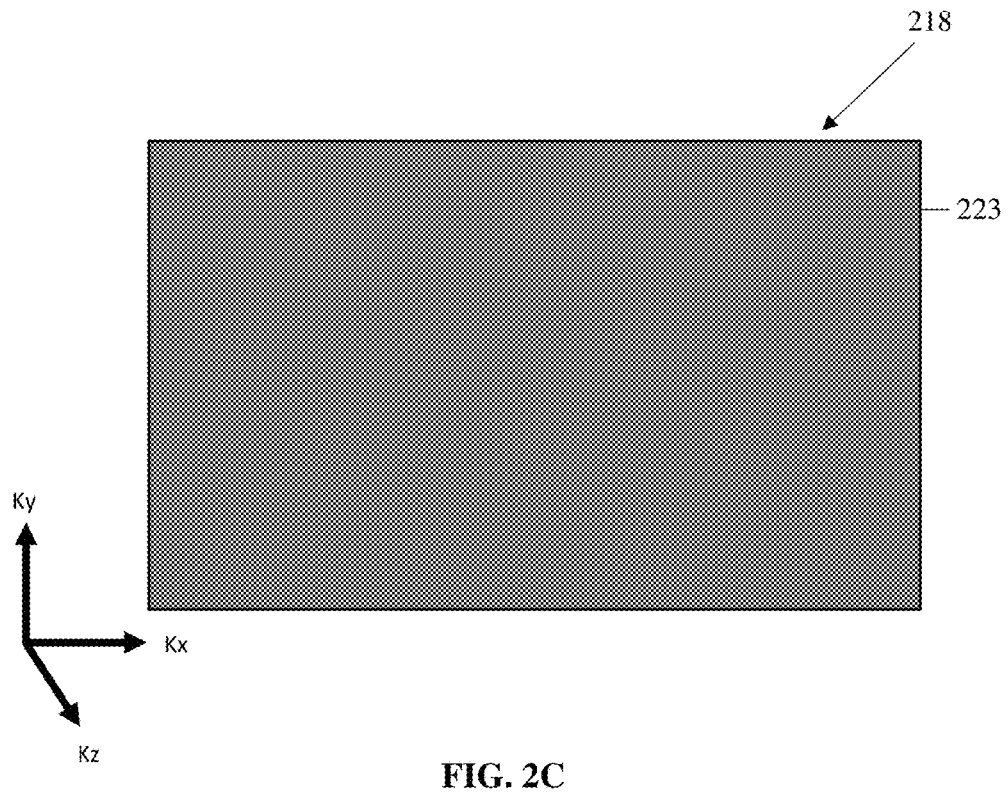
FIG. 2C shows a top view of a conformable heat sink pedestal according to an aspect of the present disclosure shown in FIG. 2A.

FIG. 2C shows a top view of a conformable heat sink pedestal 218 according to an aspect of the present disclosure shown in FIG. 2A.

The top view may show a solid plane of the third layer 223 of the composite material.

In one aspect, mathematical calculations may be carried out to obtain the planar and the lateral thermal conductivities of the composite material.

In the aspect shown in FIG. 2A, the primary material in the first layer 221 and the third layer 223 may include graphite. Graphite may have a bulk thermal conductivity (k) of 400 Watts per meter per Kelvin (W/m·K). For the sake of convenience, the thickness (t) of each of the first layer 221 and the third layer 223 may be 1 mm.

The secondary material may include a silica composite. Silica composite may have a bulk thermal conductivity of 6.0 W/m·K. The thickness of the second layer 222 may be 0.2 mm.

The total thickness (T) of the composite material may then be 2.2 mm.

The effective conductivity of the composite material in the lateral direction, Kz may be given by Eq. 1.

$$Kz = T/\Sigma(t_i/k_i) \tag{Eq. 1}$$

where "i" in Eq. 1 represents the layer number (i.e., 1, 2, or 3)

In the aspect shown in FIG. 2A,
T=2.2 mm
$t_1=t_3=1$ mm; $t_2=0.2$ mm
$k_1=k_3=400$ W/m·K; $k_2=6.0$ W/m·K Based on Eq. 1, the calculated lateral thermal conductivity of the three-layered composite material may be about 57 W/m·K.

The effective conductivity of the composite material in the planar direction, Kx, Ky, may be given by Eq. 2.

$$Kx \text{ or } Ky = \Sigma(t_i * k_i)/T \tag{Eq. 2}$$

where "i" in Eq. 2 represents the layer number (i.e., 1, 2, or 3)

Based on Eq. 2, the calculated planar thermal conductivity of the three-layered composite material may be about 364 W/m·K.

The conductivity ratio of Kz to Kx (or Ky) may then be about 0.16.

Thus, in the aspect shown in FIG. 2A, the lateral thermal conductivity (Kz) of the three-layered composite material may be more than one-tenth of its planar thermal conductivity (Kx, Ky).

Figures 3A, 3B:
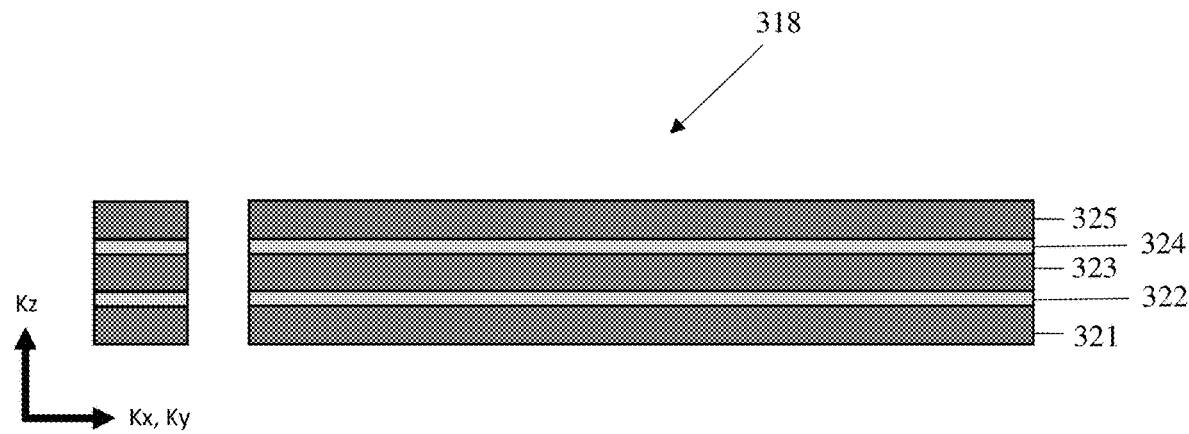
FIG. 3A shows a cross-section view of a conformable heat sink pedestal according to an aspect of the present disclosure.
FIG. 3B shows a side view of a conformable heat sink pedestal according to an aspect of the present disclosure shown in FIG. 3A.

FIG. 3A shows a cross-section view of a conformable heat sink pedestal 318 according to another aspect of the present disclosure, which may include a 5-layered composite material.

In one aspect, the composite material of the heat sink pedestal 318 may include a total of five distinct layers. A first layer 321 may include a first primary material of the composite material. A second layer 322 may include a secondary material of the composite material. A third layer 323 may include a second primary material of the composite material. A fourth layer 324 may include a second secondary material of the composite material. A fifth layer 325 may include a third primary material of the composite material.

The second layer 322 may be arranged between the first and third layers (321, 323) of the composite material. The fourth layer 324 may be arranged between the third and fifth layers (323, 325) of the composite material. The first, second, and third primary material of the composite material may be the same or different from one another. The first and second secondary material of the composite material may be the same or different from each other. Each of the five layers (321, 322, 323, 324, 325) may include a same or different thickness from one another.

FIG. 3B shows a side view of a conformable heat sink pedestal 318 according to an aspect of the present disclosure shown in FIG. 3A.

The composite material may include a planar thermal conductivity (Kx, Ky) in an x-y axis. The composite material may include a lateral thermal conductivity (Kz) in the z-axis.

Figure 3C:
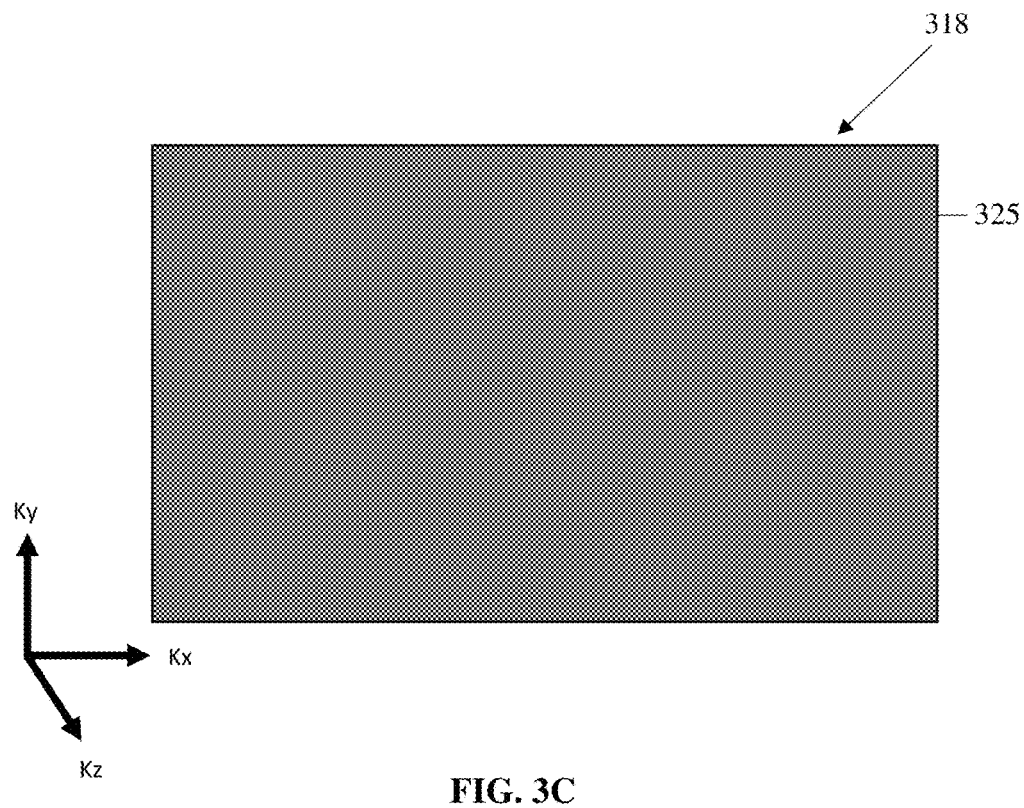
FIG. 3C shows a top view of a conformable heat sink pedestal according to an aspect of the present disclosure shown in FIG. 3A.

FIG. 3C shows a top view of a conformable heat sink pedestal 318 according to an aspect of the present disclosure shown in FIG. 3A.

The top view may show a solid plane of the third layer 325 of the composite material.

In one aspect, mathematical calculations may be carried out to obtain the planar and the lateral thermal conductivities of the composite material.

In the aspect shown in FIG. 3A, the primary material in the first layer 321, the third layer 323, and the fifth layer 325 may include graphite. Graphite may have a bulk thermal conductivity (k) of 400 W/m·K. For the sake of convenience, the thickness (t) of each of the first layer 321, the third layer 323, and the fifth layer 325 may be 1 mm.

The secondary material may include a silica composite. Silica composite may have a bulk thermal conductivity of 6.0 W/m·K. The thickness of each of the second layer 322 and the fourth layer 324 may be 0.2 mm.

The total thickness (T) of the composite material may then be 3.4 mm.

The effective conductivity of the composite material in the lateral direction, Kz may be given by Eq. 1.

$$Kz = T/\Sigma(t_i/k_i) \qquad \text{(Eq. 1)}$$

where "i" in Eq. 1 represents the layer number (i.e., 1, 2, 3, 4, or 5)

In the aspect shown in FIG. 3A,

T=3.4 mm $t_1=t_3=t_5=1$ mm; $t_2=t_4=0.2$ mm $k_1=k_3=k_5=400$ W/m·K; $k_2=k_4=6.0$ W/m·K

Based on Eq. 1, the calculated lateral thermal conductivity of the five-layered composite material may be about 46 W/m·K.

The effective conductivity of the composite material in the planar direction, Kx, Ky, may be given by Eq. 2.

$$Kx \text{ or } Ky = \Sigma(t_i \ast k_i)/T \qquad \text{(Eq. 2)}$$

where "i" in Eq. 2 represents the layer number (i.e., 1, 2, 3, 4, or 5)

Based on Eq. 2, the calculated planar thermal conductivity of the five-layered composite material may be about 354 W/m·K.

The conductivity ratio of Kz to Kx (or Ky) may then be about 0.13.

Thus, in the aspect shown in FIG. 3A, the lateral thermal conductivity (Kz) of the five-layered composite material may be more than one-tenth of its planar thermal conductivity (Kx, Ky).

Figures 4A, 4B:
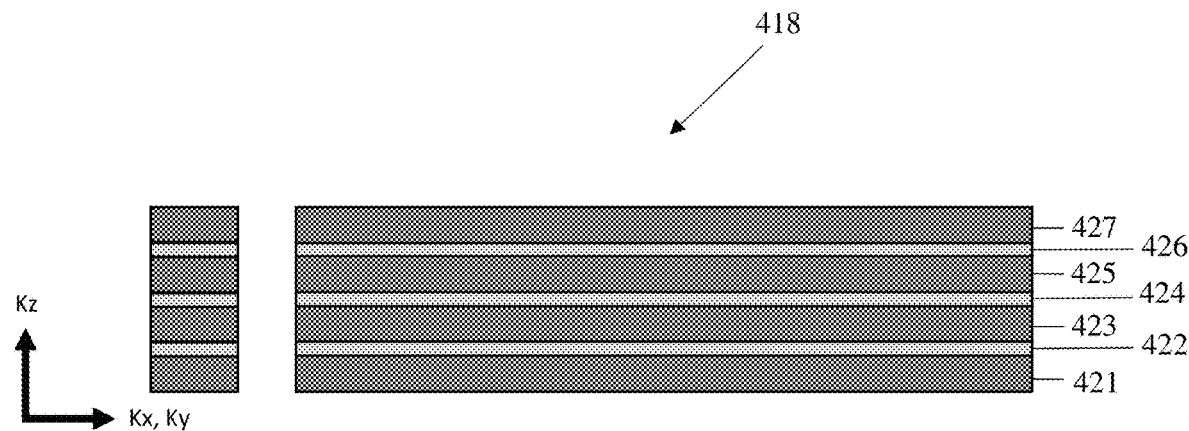
FIG. 4A shows a cross-section view of a conformable heat sink pedestal according to an aspect of the present disclosure.
FIG. 4B shows a side view of a conformable heat sink pedestal according to an aspect of the present disclosure shown in FIG. 4A.

FIG. 4A shows a cross-section view of a conformable heat sink pedestal 418 according to another aspect of the present disclosure, which may include a 7-layered composite material.

In one aspect, the composite material of the heat sink pedestal 418 may include a total of seven distinct layers. A first layer 421 may include a first primary material of the composite material. A second layer 422 may include a secondary material of the composite material. A third layer 423 may include a second primary material of the composite material. A fourth layer 424 may include a second secondary material of the composite material. A fifth layer 425 may include a third primary material of the composite material. A sixth layer 426 may include a third secondary material of the composite material. A seventh layer 427 may include a fourth primary material of the composite material. The second layer 422 may be arranged between the first and third layers (421, 423) of the composite material. The fourth layer 424 may be arranged between the third and fifth layers (423, 425) of the composite material. The sixth layer 426 may be arranged between the fifth and seventh layers (425, 427) of the composite material. The first, second, third, and fourth primary material of the composite material may be the same or different from one another. The first, second, and third secondary material of the composite material may be the same or different from each other. Each of the seven layers (421, 422, 423, 424, 425, 426, 427) may include a same or different thickness from one another.

FIG. 4B shows a side view of a conformable heat sink pedestal 418 according to an aspect of the present disclosure shown in FIG. 4A.

The composite material may include a planar thermal conductivity (Kx, Ky) in an x-y axis. The composite material may include a lateral thermal conductivity (Kz) in the z-axis.

Figure 4C:
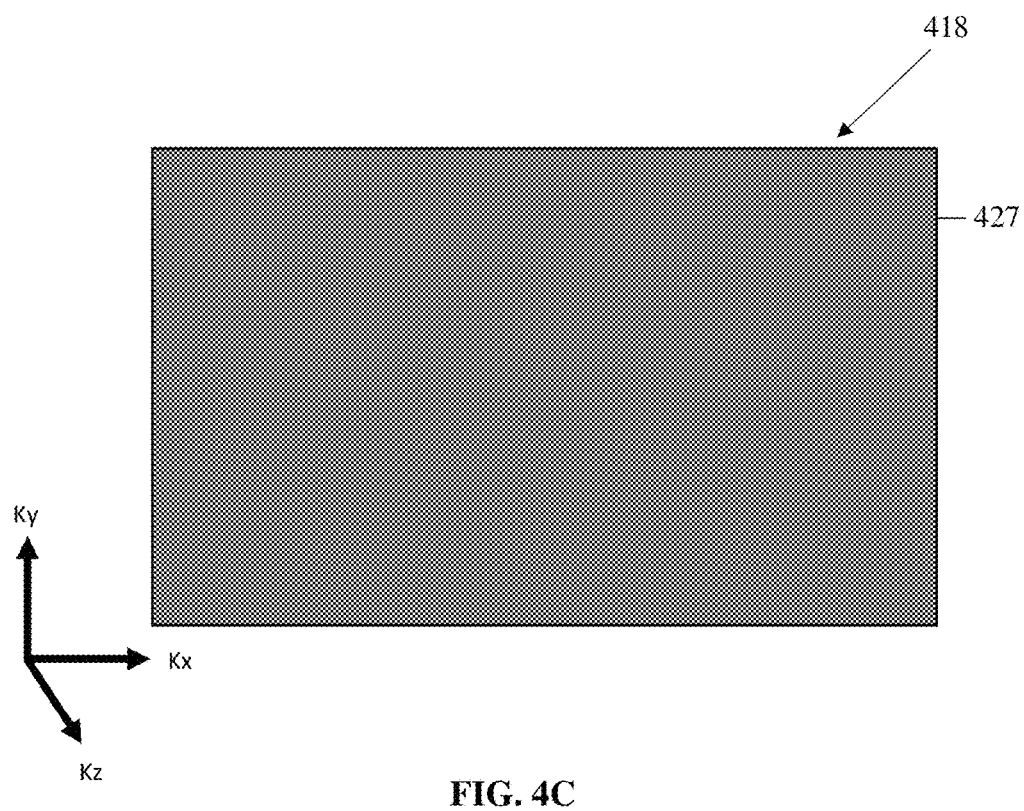
FIG. 4C shows a top view of a conformable heat sink pedestal according to an aspect of the present disclosure shown in FIG. 4A.

FIG. 4C shows a top view of a conformable heat sink pedestal 418 according to an aspect of the present disclosure shown in FIG. 4A.

The top view may show a solid plane of the third layer 427 of the composite material.

In one aspect, mathematical calculations may be carried out to obtain the planar and the lateral thermal conductivities of the composite material.

In the aspect shown in FIG. 4A, the primary material in the first layer 421, the third layer 423, the fifth layer 425, and the seventh layer 427 may include graphite. Graphite may have a bulk thermal conductivity (k) of 400 W/m·K. For the sake of convenience, the thickness (t) of each of the first layer 421, the third layer 423, the fifth layer 425, and the seventh layer 427 may be 1 mm.

The secondary material may include a silica composite. Silica composite may have a bulk thermal conductivity of 6.0 W/m·K. The thickness of each of the second layer 422, the fourth layer 424, and the sixth layer 426 may be 0.2 mm.

The total thickness (T) of the composite material may then be 4.6 mm.

The effective conductivity of the composite material in the lateral direction, Kz may be given by Eq. 1.

$$Kz = T/\Sigma(t_i/k_i) \qquad \text{(Eq. 1)}$$

where "i" in Eq. 1 represents the layer number (i.e., 1, 2, 3, 4, 5, 6, or 7)

In the aspect shown in FIG. 4A,

T=4.6 mm $t_1=t_3=t_5=t_7=1$ mm; $t_2=t_4=t_6=0.2$ mm $k_1=k_3=k_5=k_7=400$ W/m·K; $k_2=k_4=k_6=6.0$ W/m·K

Based on Eq. 1, the calculated lateral thermal conductivity of the seven-layered composite material may be about 42 W/m·K.

The effective conductivity of the composite material in the planar direction, Kx, Ky, may be given by Eq. 2.

$$Kx \text{ or } Ky = \Sigma(t_i * k_i)/T \quad \text{(Eq. 2)}$$

where "i" in Eq. 2 represents the layer number (i.e., 1, 2, 3, 4, 5, 6, or 7)

Based on Eq. 2, the calculated planar thermal conductivity of the seven-layered composite material may be about 349 W/m·K.

The conductivity ratio of Kz to Kx (or Ky) may then be about 0.12.

Thus, in the aspect shown in FIG. 4A, the lateral thermal conductivity (Kz) of the seven-layered composite material may be more than one-tenth of its planar thermal conductivity (Kx, Ky).

In an aspect of the present disclosure, the composite material may be compressible. For example, ASTM D2240 is a testing standard for a material's hardness/softness using a device called Shore Durometer. ASTM D2240 is widely adopted for compressibility testing of materials. Briefly, if the test material is soft, then the durometer scale is low, i.e., easier to compress. On the other hand, if the test material is hard, then the durometer scale is high, i.e., harder to compress. As an illustration, for a rubber band, the ASTM D2240 durometer scale may be 25. Therefore, in one aspect, the composite material may include an ASTM D2240 durometer scale of less than 25. In an aspect, a secondary material may be included in the composite material to improve the compressibility of the composite material.

In an aspect of the present disclosure, the composite material may be electrically insulating. For example, the composite material may include a dielectric constant Dk of less than 8.

In an aspect of the present disclosure, the composite material may include a high thermal endurance due to the operating conditions of the first chip 112 or the second chip 114. During normal operation or use, the hottest point of the first chip 112 or the second chip 114 may be as high as 110° C., for example. Therefore, the composite material may include a thermal endurance of up to 200° C. to withstand the high operating conditions of the first chip 112 and the second chip 114. In one aspect, components of the first chip 112 or the second chip 114 may start to melt and fail beyond the thermal endurance threshold.

The heat sink 116 may be positioned as close to the first chip 112 and the second chip 114 as possible for a more efficient heat transfer operation. This may also lead to a more compact final product design. In an aspect of the present disclosure, the composite material may include a thickness of not more than 5 mm. For example, the composite material may include a thickness of 0.5 mm to 5 mm.

The heat sink pedestal 118 may be stored for a period of time after its production and may be attached to the base of the heat sink 116 just before the assembly. For storage purposes, the composite material of the heat sink 118 may include a low moisture absorption. In an aspect of the present disclosure, the composite material may include a moisture absorption of 0.5% to 3.0%.

A series of thermal simulations were conducted to validate the properties of the heat sink pedestal. In the simulations, the unction temperatures (Tj) for a multi-chip package (MCP) which may be defined at the hottest location on a first chip and a second chip were monitored, which are summarized in Table 1.

TABLE 1

Thermal simulation results on Tj comparing a conventional metal pedestal with a thermal interface material and the new heat sink pedestal

| Scenario | 1 (current technology) | 2 (present disclosure) |
|---|---|---|
| Description | Heat sink with metal pedestal and gap pad | Heat sink with present composite material |
| Ambient temperature simulated | 35° C. | 35° C. |
| Package Power simulated | 15 W | 15 W |
| Gap filler thermal conductivity | 5 W/m · K | — |
| Aluminum pedestal thermal conductivity | 201 W/m · K | — |
| Present composite material thermal conductivity | — | Kx = 90 W/m · K (planar) Ky = 90 W/m · K (planar) Kz = 9 W/m · K (lateral) |
| Tj on Chip #1 | 106.9° C. | 107° C. |
| Tj on Chip #2 | 73.1° C. | 73.4° C. |

Scenario 1 shows the simulation results on a typical setup whereby an aluminum pedestal is used with a gap filler attached to it. The simulation assumed the ambient temperature at 35° C. when the MCP is running at 15 W of power (14.3 W on chip 1, and 0.7 W on chip 2).

Scenario 2 shows the simulation results when the pedestal and gap filler are replaced by the composite material according to an aspect of the present disclosure, having orthotropic conductivity (Kx=Ky=90 W/m·K, Kz=9 W/m·K). The Tj on both scenarios were very much the same, which may imply that the heat transfer efficiency and effectiveness are very close. Therefore, by providing a composite material according to various aspects of the present disclosure including a thermal conductivity relationship as described herein, the composite may have the potential to replace a conventional metal pedestal and a thermal interface material with equivalent heat transfer performance.

Figure 5:
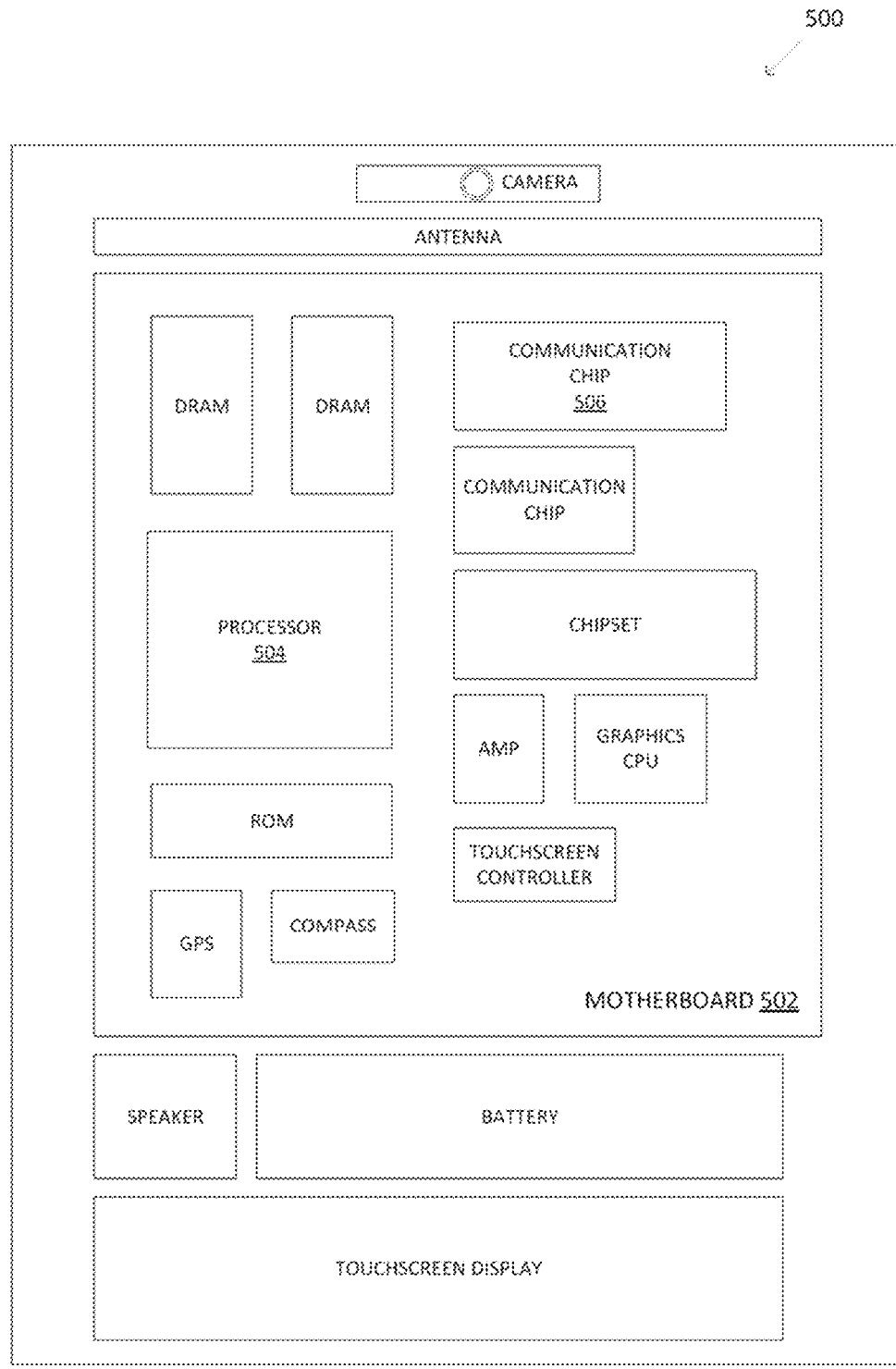
FIG. 5 shows an illustration of a computing device that includes a device according to a further aspect of the present disclosure.

Aspects of the present disclosure may be implemented into a system using any suitable hardware and/or software. FIG. 5 schematically illustrates a computing device 500 that may include a semiconductor package as described herein, in accordance with some aspects. The computing device 500 may house a board such as a motherboard 502. The motherboard 502 may include a number of components, including but not limited to a processor 504 and at least one communication chip 506. The processor 504, which may have a device according to the present disclosure, may be physically and electrically coupled to the motherboard 502. In some implementations, the at least one communication chip 506 may also be physically and electrically coupled to the motherboard 502. In further implementations, the communication chip 506 may be part of the processor or package 504.

Depending on its applications, computing device 500 may include other components that may or may not be physically and electrically coupled to the motherboard 502. These other components may include, but are not limited to, volatile memory (e.g. DRAM), non-volatile memory (e.g. ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 504 of the computing device 500 may be packaged in device as described herein.

The communication chip 506 may enable wireless communications for the transfer of data to and from the computing device 500. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

Figure 6:
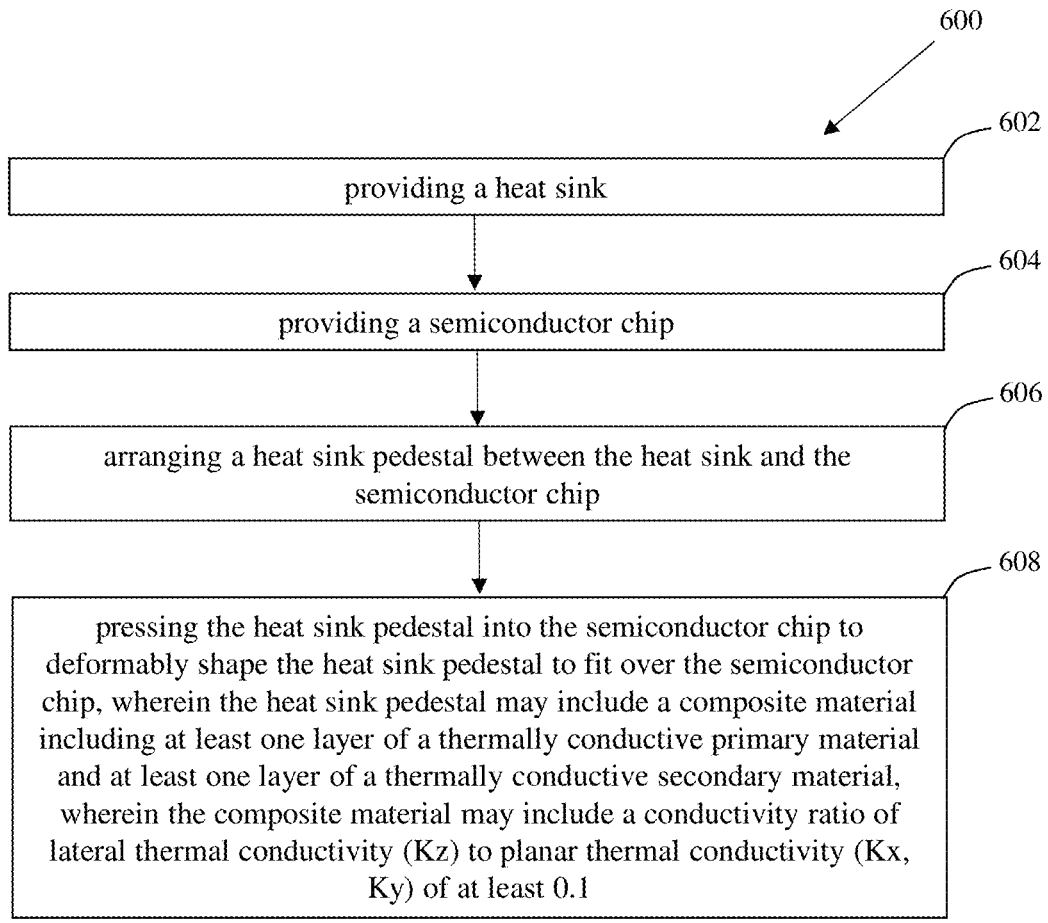
FIG. 6 shows a flow chart illustrating a method for providing a thermal contact between a heat sink and a semiconductor chip according to an aspect of the present disclosure.

FIG. 6 shows a flow chart illustrating a method 600 of providing a thermal contact between a heat sink and a semiconductor chip according to an aspect of the present disclosure.

As shown in FIG. 6, at operation 602, the method of providing a thermal contact between a heat sink and a semiconductor chip may include providing a heat sink.

At operation 604, the method may include providing a semiconductor chip.

At operation 606, the method may include arranging a heat sink pedestal between the heat sink and the semiconductor chip.

At operation 608, the method may include pressing the heat sink pedestal into the semiconductor chip to deformably shape the heat sink pedestal to fit over the semiconductor chip, wherein the heat sink pedestal may include a composite material including at least one layer of a thermally conductive primary material and at least one layer of a thermally conductive secondary material, wherein the composite material may include a conductivity ratio of lateral thermal conductivity (Kz) to planar thermal conductivity (Kx, Ky) of at least 0.1

It will be understood that the above operations described above relating to FIG. 6 are not limited to this particular order. Any suitable, modified order of operations may be used.

EXAMPLES

Example 1 may include a device including a heat sink, at least one semiconductor chip, and a heat sink pedestal arranged between the heat sink and the semiconductor chip, wherein the heat sink pedestal includes a composite material including at least one layer of a thermally conductive primary material and at least one layer of a thermally conductive secondary material, wherein the composite material may include a conductivity ratio of lateral thermal conductivity (Kz) to planar thermal conductivity (Kx, Ky) of at least 0.1 and wherein the heat sink pedestal may conform to a shape of the at least one semiconductor chip.

Example 2 may include the device of example 1 and/or any other example disclosed herein, wherein the lateral thermal conductivity (Kz) of the composite material is given by Eq. 1, $$Kz = T/\Sigma(t_i/k_i) \quad\quad\quad (\text{Eq. 1})$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

Example 3 may include the device of example 1 and/or any other example disclosed herein, wherein the planar thermal conductivity (Kx, Ky) of the composite material is given by Eq. 2, $$Kx \text{ or } Ky = \Sigma(t_i * k_i)/T \quad\quad\quad (\text{Eq. 2})$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

Example 4 may include the device of example 1 and/or any other example disclosed herein, wherein the thermally conductive primary material may include graphite, graphene, silver, copper, or aluminum.

Example 5 may include the device of example 1 and/or any other example disclosed herein, wherein the thermally conductive secondary material may include a silica composite, alumina foam, alumina-silica fiber, manganese, nickel, copper, silver, silver-copper, tin, carbon fiber, aluminum, alumina, boron nitride, or aluminum nitride particles.

Example 6 may include the device of example 1 and/or any other example disclosed herein, wherein the thermally conductive primary material may include graphite or graphene and the thermally conductive secondary material may include a silica composite.

Example 7 may include the device of example 1 and/or any other example disclosed herein, wherein the thermally conductive primary material has a higher thermal conductivity than the thermally conductive secondary material, and further wherein the layer of the thermally conductive primary material may be thicker than the layer of the thermally conductive secondary material.

Example 8 may include the device of example 1 and/or any other example disclosed herein, wherein the composite material may further include a hardness on a durometer scale of less than 25 based on industrial ASTM D2240 test standard.

Example 9 may include the device of example 1 and/or any other example disclosed herein, wherein the composite material may further include a dielectric constant of less than 8.0.

Example 10 may include the device of example 1 and/or any other example disclosed herein, wherein the composite material may further include a thermal endurance of up to 200° C.

Example 11 may include the device of example 1 and/or any other example disclosed herein, wherein the composite material may further include a moisture absorption of 0.5 to 3.0%.

Example 12 may include the device of example 1 and/or any other example disclosed herein, wherein the composite material may further include a total thickness of 0.5 to 5 mm.

Example 13 may include a heat sink pedestal including a composite material including at least one layer of a thermally conductive primary material and at least one layer of a thermally conductive secondary material, wherein the composite material may include a conductivity ratio of lateral thermal conductivity (Kz) to planar thermal conductivity (Kx, Ky) of at least 0.1, and wherein the heat sink pedestal may be conformable to a shape of a semiconductor chip.

Example 14 may include the heat sink pedestal of example 13 and/or any other example disclosed herein, wherein the lateral thermal conductivity (Kz) of the composite material may be given by Eq. 1, $$Kz = T/\Sigma(t_i/k_i) \quad \text{(Eq. 1)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

Example 15 may include the heat sink pedestal of example 13 and/or any other example disclosed herein, wherein the planar thermal conductivity (Kx, Ky) of the composite material may be given by Eq. 2, $$Kx \text{ or } Ky = \Sigma(t_i * k_i)/T \quad \text{(Eq. 2)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

Example 16 may include the heat sink pedestal of example 13 and/or any other example disclosed herein, wherein the composite material may further include a durometer scale of less than 25 based on industrial ASTM D2240 test standard.

Example 17 may include a method including providing a heat sink, providing a semiconductor chip, arranging a heat sink pedestal between the heat sink and the semiconductor chip, pressing the heat sink pedestal into the semiconductor chip to deformably shape the heat sink pedestal to fit over the semiconductor chip, wherein the heat sink pedestal may include a composite material including at least one layer of a thermally conductive primary material and at least one layer of a thermally conductive secondary material, wherein the composite material may include a conductivity ratio of lateral thermal conductivity (Kz) to planar thermal conductivity (Kx, Ky) of at least 0.1.

Example 18 may include the method of example 17 and/or any other example disclosed herein, wherein the lateral thermal conductivity (Kz) of the composite material may be given by Eq. 1, $$Kz = T/\Sigma(t_i/k_i) \quad \text{(Eq. 1)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

Example 19 may include the method of example 17 and/or any other example disclosed herein, wherein the planar thermal conductivity (Kx, Ky) of the composite material may be given by Eq. 2, $$Kx \text{ or } Ky = \Sigma(t_i * k_i)/T \quad \text{(Eq. 2)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

Example 20 may include the method of example 17 and/or any other example disclosed herein, wherein the composite material may further include a hardness on a durometer scale of less than 25 based on industrial ASTM D2240 test standard.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
a heat sink;
at least one semiconductor chip; and
a heat sink pedestal arranged between the heat sink and the semiconductor chip,
wherein the heat sink pedestal comprises:
a composite material comprising:
at least one layer of a thermally conductive primary material; and
at least one layer of a thermally conductive secondary material,
wherein the composite material comprises a conductivity ratio of lateral thermal conductivity (Kz) to planar thermal conductivity (Kx, Ky) of at least 0.1, and
wherein the heat sink pedestal conforms to a shape of the at least one semiconductor chip.

2. The device of claim 1, wherein the lateral thermal conductivity (Kz) of the composite material is given by Eq. 1, $$Kz = T/\Sigma(t_i/k_i) \quad \text{(Eq. 1)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

3. The device of claim 1, wherein the planar thermal conductivity (Kx, Ky) of the composite material is given by Eq. 2, $$Kx \text{ or } Ky = \Sigma(t_i * k_i)/T \quad \text{(Eq. 2)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

4. The device of claim 1, wherein the thermally conductive primary material comprises graphite, graphene, silver, copper, or aluminum.

5. The device of claim 1, wherein the thermally conductive secondary material comprises a silica composite, alumina foam, alumina-silica fiber, manganese, nickel, copper, silver, silver-copper, tin, carbon fiber, aluminum, alumina, boron nitride, or aluminum nitride particles.

6. The device of claim 1, wherein the thermally conductive primary material comprises graphite or graphene and the thermally conductive secondary material comprises a silica composite.

7. The device of claim 1, wherein the thermally conductive primary material has a higher thermal conductivity than the thermally conductive secondary material, and further wherein the layer of the thermally conductive primary material is thicker than the layer of the thermally conductive secondary material.

8. The device of claim 1, wherein the composite material further comprises a hardness on a durometer scale of less than 25 based on industrial ASTM D2240 test standard.

9. The device of claim 1, wherein the composite material further comprises a dielectric constant of less than 8.0.

10. The device of claim 1, wherein the composite material further comprises a thermal endurance of up to 200° C.

11. The device of claim 1, wherein the composite material further comprises a moisture absorption of 0.5 to 3.0 percent.

12. The device of claim 1, wherein the composite material further comprises a total thickness of 0.5 to 5 mm.

13. A heat sink pedestal comprising:
a composite material comprising:
at least one layer of a thermally conductive primary material; and
at least one layer of a thermally conductive secondary material;
wherein the composite material comprises a conductivity ratio of lateral thermal conductivity (Kz) to planar thermal conductivity (Kx, Ky) of at least 0.1, and
wherein the heat sink pedestal is conformable to a shape of a semiconductor chip.

14. The heat sink pedestal of claim 13, wherein the lateral thermal conductivity (Kz) of the composite material is given by Eq. 1, $$Kz = T/\Sigma(t_i/k_i) \quad \text{(Eq. 1)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

15. The heat sink pedestal of claim 13, wherein the planar thermal conductivity (Kx, Ky) of the composite material is given by Eq. 2, $$Kx \text{ or } Ky = \Sigma(t_i * k_i)/T \quad \text{(Eq. 2)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

16. The heat sink pedestal of claim 13, wherein the composite material further comprises a hardness on a durometer scale of less than 25 based on industrial ASTM D2240 test standard.

17. A method comprising:
providing a heat sink;
providing a semiconductor chip;
arranging a heat sink pedestal between the heat sink and the semiconductor chip,
pressing the heat sink pedestal into the semiconductor chip to deformably shape the heat sink pedestal to fit over the semiconductor chip,
wherein the heat sink pedestal comprises:
a composite material comprising:
 at least one layer of a thermally conductive primary material; and
 at least one layer of a thermally conductive secondary material;
wherein the composite material comprises a conductivity ratio of lateral thermal conductivity (Kz) to planar thermal conductivity (Kx, Ky) of at least 0.1.

18. The method of claim 17, wherein the lateral thermal conductivity (Kz) of the composite material is given by Eq. 1, $$Kz = T/\Sigma(t_i/k_i) \quad \text{(Eq. 1)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

19. The method of claim 17, wherein the planar thermal conductivity (Kx, Ky) of the composite material is given by Eq. 2, $$Kx \text{ or } Ky = \Sigma(t_i * k_i)/T \quad \text{(Eq. 2)}$$

wherein:
T represents the total thickness of the composite material;
i is an integer and represents the $i^{th}$ layer in the composite material;
t represents the thickness of a layer in the composite material;
k represents the bulk thermal conductivity of a layer in the composite material.

20. The method of claim 17, wherein the composite material further comprises a hardness on a durometer scale of less than 25 based on industrial ASTM D2240 test standard.

* * * * *